United States Patent
Oda et al.

(10) Patent No.: US 8,735,213 B2
(45) Date of Patent: May 27, 2014

(54) ELECTRODE, PHOTOELECTRIC CONVERSION DEVICE USING THE ELECTRODE, AND MANUFACTURING METHOD THEREOF

(75) Inventors: Yuji Oda, Kanagawa (JP); Takashi Hirose, Kanagawa (JP); Koichiro Tanaka, Kanagawa (JP); Sho Kato, Kanagawa (JP); Emi Koezuka, Kanagawa (JP)

(73) Assignee: Semiconductor Energy Laboratory Co., Ltd., Kanagawa-ken ( * ) Notice: Subject to any disclaimer, the term of this patent is extended or adjusted under 35 U.S.C. 154(b) by 0 days.

(21) Appl. No.: 13/325,166

(22) Filed: Dec. 14, 2011

(65) Prior Publication Data
US 2012/0161130 A1 Jun. 28, 2012

(30) Foreign Application Priority Data

Dec. 23, 2010 (JP) ................. 2010-286810

(51) Int. Cl.
*H01L 21/28* (2006.01)
(52) U.S. Cl.
USPC ........... 438/98; 438/57; 438/96; 257/E21.158
(58) Field of Classification Search
USPC ................. 438/96, 98; 257/E21.158
See application file for complete search history.

(56) References Cited

U.S. PATENT DOCUMENTS

| | | | |
|---|---|---|---|
| 4,626,613 A * | 12/1986 | Wenham et al. | 136/255 |
| 4,726,850 A | 2/1988 | Wenham et al. | |
| 4,748,130 A | 5/1988 | Wenham et al. | |
| 4,916,503 A | 4/1990 | Uematsu et al. | |
| 5,356,488 A | 10/1994 | Hezel | |
| 5,449,626 A | 9/1995 | Hezel | |
| 7,858,451 B2 | 12/2010 | Maekawa et al. | |
| 7,939,822 B2 | 5/2011 | Maekawa et al. | |
| 2004/0058468 A1 | 3/2004 | Takahashi et al. | |

(Continued)

FOREIGN PATENT DOCUMENTS

| | | |
|---|---|---|
| JP | 61-005584 | 1/1986 |
| JP | 2006-054374 | 2/2006 |

OTHER PUBLICATIONS

Mason et al., "A high Efficiency Silicon Solar Cell Production Technology", 10$^{th}$ European Photovoltaic Solar Energy Conference, Apr. 8-12, 1991, pp. 280-283.

(Continued)

*Primary Examiner* — Angel Roman
(74) *Attorney, Agent, or Firm* — Nixon Peabody LLP; Jeffrey L. Costellia

(57) ABSTRACT

A minute electrode, a photoelectric conversion device including the minute electrode, and manufacturing methods thereof are provided. A plurality of parallel groove portions and a region sandwiched between the groove portions are formed in a substrate, and a conductive resin is supplied to the groove portions and the region and is fixed, whereby the groove portions are filled with the conductive resin and the region is covered with the conductive resin. The supplied conductive resin is not expanded outward, and the electrode with a designed width can be formed. Part of the electrode is formed over the region sandwiched between the groove portions, thus, the area of a cross section in the short axis direction can be large, and a low resistance in the long axis direction can be obtained.

13 Claims, 11 Drawing Sheets

(56) References Cited

U.S. PATENT DOCUMENTS

| | | | |
|---|---|---|---|
| 2005/0126627 A1* | 6/2005 | Hayashida | 136/257 |
| 2007/0249085 A1* | 10/2007 | Ojima et al. | 438/64 |
| 2009/0007962 A1* | 1/2009 | Wenham et al. | 136/256 |
| 2009/0314338 A1* | 12/2009 | Basore et al. | 136/255 |
| 2010/0154874 A1 | 6/2010 | Hirose et al. | |
| 2010/0258813 A1* | 10/2010 | Lee et al. | 257/76 |
| 2011/0000545 A1 | 1/2011 | Nishi et al. | |

OTHER PUBLICATIONS

European Search Report (Application No. 11194774.3; EP14454) Dated May 2, 2013.

* cited by examiner

ELECTRODE, PHOTOELECTRIC CONVERSION DEVICE USING THE ELECTRODE, AND MANUFACTURING METHOD THEREOF

BACKGROUND OF THE INVENTION

1. Field of the Invention

The present invention relates to a minute electrode, a photoelectric conversion device including the minute electrode, and manufacturing methods thereof.

2. Description of the Related Art

In recent years, a photoelectric conversion device that generates power without carbon dioxide emissions has attracted attention as a countermeasure against global warming. A solar battery using a crystalline silicon substrate such as a single crystal silicon substrate or a polycrystalline silicon substrate is known as a typical example of the photoelectric conversion device.

In general, a grid electrode which is used for current collection and serves as a wiring is provided on a light-receiving surface side of a solar battery. The grid electrode is formed of a metal film or a conductive resin film, and a region which is the shade of the grid electrode is a region which does not directly contribute to power generation. Thus, the width of the grid electrode is expected to be small, so that the area of the grid electrode is reduced.

It is preferable that a cross section alone the short-axis of the grid electrode have a shape with a high aspect ratio so as not to increase resistance and the area of the cross section be increased when the width of the grid electrode is made small. As a means for forming such a grid electrode, formation of a built-in electrode is being attempted (see Patent Document 1 and Non Patent Document 1).

The technique disclosed in Patent Document 1 is a method in which a dicing process is performed on a crystalline silicon substrate to form a groove portion and the groove portion is filled with a conductive resin under a reduced pressure by a screen printing method. Further, the technique disclosed in Non Patent Document 1 is a method in which a laser process is performed on a crystalline silicon substrate to form a groove portion and the groove portion is filled with a conductive film by an electroless plating method.

REFERENCE

Patent Document

[Patent Document 1] Japanese Published Patent Application No. 2006-54374

Non-Patent Document

N. B. Mason, D. Jordan, J. G. Summers, *Proceedings of the 10$^{th}$ European Photovoltaic Solar Energy Conference* (1991) 280.

SUMMARY OF THE INVENTION

In an electroless plating method, contamination of a semiconductor substrate from a plating solution and the like is a concern. Further, the electroless plating method is a liquid phase method; thus a process for forming a conductive layer is easily affected by bubbles remaining in a groove portion and process failure such as disconnection is easily caused.

On the other hand, a screen printing method has an advantage of being easily applicable to a large area with simple processes. However, in the screen printing method under a reduced pressure as mentioned above, an apparatus structure and a process are complicated and there are problems in that an opening portion of a printing plate is likely to become clogged because a conductive resin attached to the printing plate is quickly dried under the reduced pressure.

Accordingly, an object of one embodiment of the present invention is to provide an electrode with a low resistance and a narrow linewidth, and a manufacturing method thereof. Further, an object of one embodiment of the present invention is to provide a photoelectric conversion device including the electrode, and a manufacturing method thereof.

One embodiment of the present invention disclosed in this specification relates to an electrode formed in a plurality of parallel groove portions and a region sandwiched between the parallel groove portions, and a photoelectric conversion device including the electrode.

One embodiment of the present invention disclosed in this specification is a method for manufacturing an electrode which includes the steps of forming a plurality of parallel groove portions, supplying a conductive material to the groove portions and a region sandwiched between the groove portions, and fixing the conductive material.

Among the plurality of groove portions; a conductive material may be fixed to only part of the outermost groove portions in the outermost groove portions. Note that the outermost groove portions mean the first groove portion and n-th groove portion in n groove portions which are arranged in order from 1 to n in a region where an electrode is formed.

The above-described conductive material can be supplied by a screen printing method. Here, the width in the short axis direction of an opening portion of a printing plate used in the screen printing method is preferably smaller than the total width of the groove portions and the region sandwiched between the groove portions. The opening portion of the screen printing plate has such a shape; thus, the groove portions are easily filled with the conductive material.

One embodiment of the present invention disclosed in this specification is a method for manufacturing a photoelectric conversion device which includes the steps of forming, on one surface of a crystalline silicon substrate having one conductivity type, a first region including a first plurality of parallel groove portions and a region sandwiched between the first parallel groove portions and a second region crossing the first region and including a second plurality of parallel groove portions and a region sandwiched between the second parallel groove portions; thermally diffusing a first impurity imparting the opposite conductivity type to that of the crystalline silicon substrate into the one surface of the crystalline silicon substrate including the first region and the second region to form a first impurity layer; forming a conductive layer including a second impurity imparting the same conductivity type as that of the crystalline silicon substrate on the other surface of the crystalline silicon substrate; thermally diffusing the second impurity into the other surface of the crystalline silicon substrate to form a second impurity layer having the same conductivity type as that of the crystalline silicon substrate and having higher carrier concentration than the crystalline silicon substrate and a rear electrode formed of the conductive layer; supplying a conductive material to the groove portions and the region sandwiched between the groove portions in the first region and the second region where the first impurity layer is formed; and fixing the conductive material, so that a grid electrode is formed.

In this specification and the like, ordinal numbers such as "first", "second", and "third" are used to avoid confusion among components, and the terms do not limit the order and number of the components.

In the method for manufacturing a photoelectric conversion device, a light-transmitting insulating film may be formed over the first impurity layer, and the conductive material may be supplied to the first region and the second region where the first impurity layer and the light-transmitting insulating film are formed, and fixed.

One embodiment of the present invention disclosed in this specification is a method for manufacturing a photoelectric conversion device which includes the steps of forming, on one surface of a crystalline silicon substrate, a first region including a first plurality of parallel groove portions and a region sandwiched between the first parallel groove portions and a second region crossing the first region and including a second plurality of parallel groove portions and a region sandwiched between the second parallel groove portions; forming a first silicon semiconductor layer on the one surface of the crystalline silicon substrate including the first region and the second region; forming a second silicon semiconductor layer having one conductivity type on the first silicon semiconductor layer; forming a third silicon semiconductor layer on the other surface of the crystalline silicon substrate; forming a fourth silicon semiconductor layer having the opposite conductivity type to that of the second silicon semiconductor layer on the third silicon semiconductor layer; forming a light-transmitting conductive film on the second silicon semiconductor layer; forming a rear electrode on the fourth silicon semiconductor layer; supplying a conductive material to the groove portions and the region sandwiched between the groove portions in the first region and the second region where the first silicon semiconductor layer, the second silicon semiconductor layer, and the light-transmitting conductive, film are stacked, and fixing the conductive material, so that a grid electrode is formed.

The conductivity type of each of the first and the third silicon semiconductor layers is i-type, and the conductivity type of the second silicon semiconductor layer is p-type or n-type.

Further, one embodiment of the present invention disclosed in this specification is an electrode formed of a conductive material to fill a plurality of parallel groove portions and cover a region sandwiched between the parallel groove portions.

Among the groove portions to which the conductive material is fixed, a conductive material may be supplied to only part of the outermost groove portions in the outermost groove portions, and fixed.

One embodiment of the present invention disclosed in this specification is a photoelectric conversion device which includes a crystalline silicon substrate having one conductivity type, one surface of which is provided with a first region including a first plurality of parallel groove portions and a region sandwiched between the first parallel groove portions and a second region crossing the first region and including a second plurality of parallel groove portions and a region sandwiched between the second parallel groove portions; a first impurity layer having the opposite conductivity type to that of the crystalline silicon substrate, provided on the one surface of the crystalline silicon substrate including the first region and the second region; a second impurity layer having the same conductivity type as that of the crystalline silicon substrate and having higher carrier concentration than the crystalline silicon substrate, provided on the other surface of the crystalline silicon substrate; a rear electrode being in contact with the second impurity layer, and a grid electrode which is formed of a conductive material to cover the groove portions and the region sandwiched between the groove portions in the first region and the second region where the first impurity layer is formed.

In the above structure, a light-transmitting insulating film may be formed over the first impurity layer. The light-transmitting insulating film has an antireflection effect and an effect of reducing surface defects of the first impurity layer.

One embodiment of the present invention disclosed in this specification is a photoelectric conversion device which includes a crystalline silicon substrate, one surface of which is provided with a first region including a first plurality of parallel groove portions and a region sandwiched between the first parallel groove portions and a second region crossing the first region and including a second plurality of parallel groove portions and a region sandwiched between the second parallel groove portions; a first silicon semiconductor layer provided on the one surface of the crystalline silicon substrate including the first region and the second region; a second silicon semiconductor layer having one conductivity type provided on the first silicon semiconductor layer; a light-transmitting conductive film provided on the second silicon semiconductor layer; a third silicon semiconductor layer provided on the other surface of the crystalline silicon substrate; a fourth silicon semiconductor layer having the opposite conductivity type to that of the second silicon semiconductor layer provided on the third silicon semiconductor layer; a rear electrode provided on the fourth silicon semiconductor layer; and a grid electrode which is formed of a conductive material to cover the groove portions and the region sandwiched between the groove portions in the first region and the second region where the first silicon semiconductor layer, the second silicon semiconductor layer, and the light-transmitting conductive film are stacked.

An electrode with a low resistance and a narrow linewidth can be provided according to one embodiment of the present invention. Further, the electrode can be formed with high productivity and high yield. Furthermore, a photoelectric conversion device with improved electrical characteristics can be provided.

DETAILED DESCRIPTION OF THE INVENTION

Figure 1A:
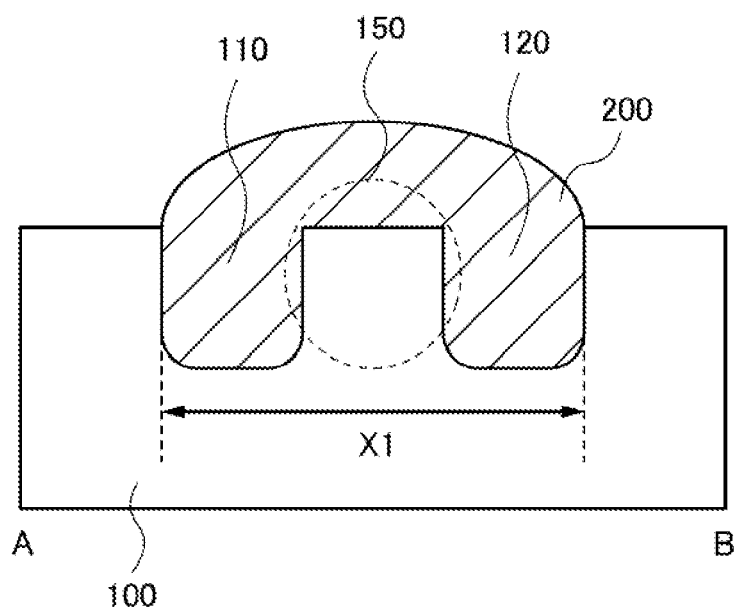
FIGS. 1A and 1B are a cross-sectional view and a plan view illustrating an electrode of one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of present invention. Therefore, the present invention is not construed as being limited to description of the embodiments. In the drawings for explaining the embodiments, the same portions or portions having similar functions are denoted by the same reference numerals, and description of such portions is not repeated in some cases.

Embodiment 1

Figure 1B:
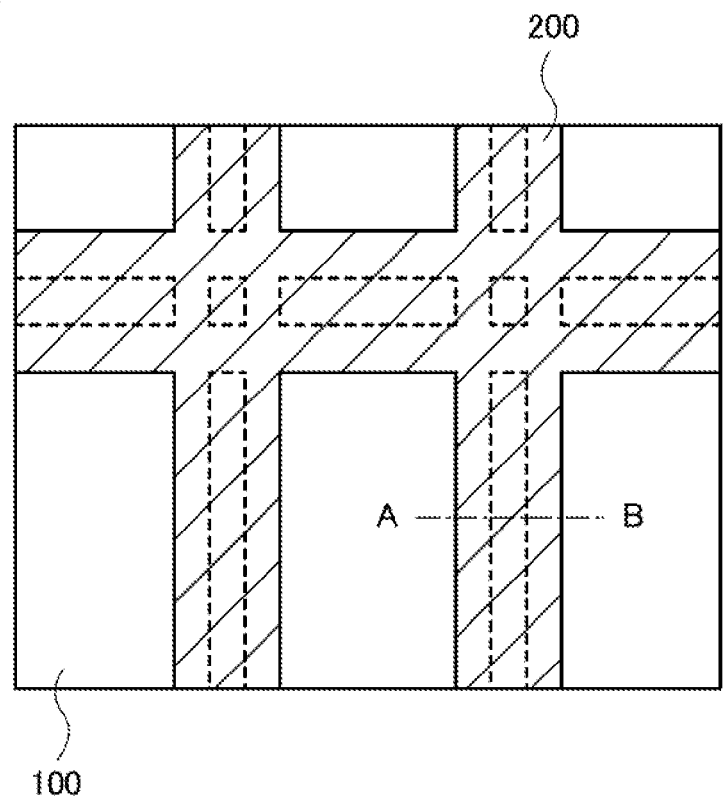

A structure of groove portions provided for a substrate and a structure of an electrode filling the groove portions, which are one embodiment of the present invention, are illustrated in FIGS. 1A and 1B. FIG. 1A is a cross-sectional view and corresponds to a cross section taken along line A-B in FIG. 1B that is a plan view. Note that an electrode of one embodiment of the present invention can be applied to a wiring as well as an electrode of an electronic device and the like, and application thereof is not limited.

In a substrate 100, a first groove portion 110 and a second groove portion 120 are provided in parallel to each other and a region 150 sandwiched between the first groove portion 110 and the second groove portion 120 is formed. Further, an electrode 200 formed of a conductive material is fixed so as to cover the first groove portion 110, the second groove portion 120, and the region 150. A conductive resin can be used as the conductive material, for example. Further, a method for fixing the conductive resin depends on a material of the conductive resin and can be performed by a method such as heat treatment, light irradiation, or volatilization of solvent as appropriate.

The width and the depth of each of the first groove portion 110, the second groove portion 120, and the region 150 sandwiched between the first groove portion 110 and the second groove portion 120 are not particularly limited as long as the strength of the substrate 100 is not reduced and may be freely determined by a practitioner. However, in order to facilitate the process in a screen printing method described later, the width of the region 150 is preferably wider than that of the first groove portion 110 or the second groove portion 120.

Figure 2:
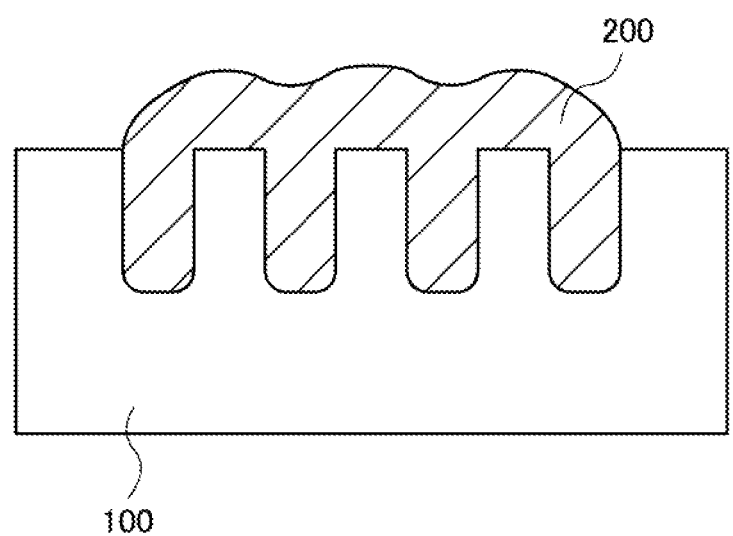
FIG. 2 is a cross-sectional view illustrating an electrode of one embodiment of the present invention.
Figure 3:
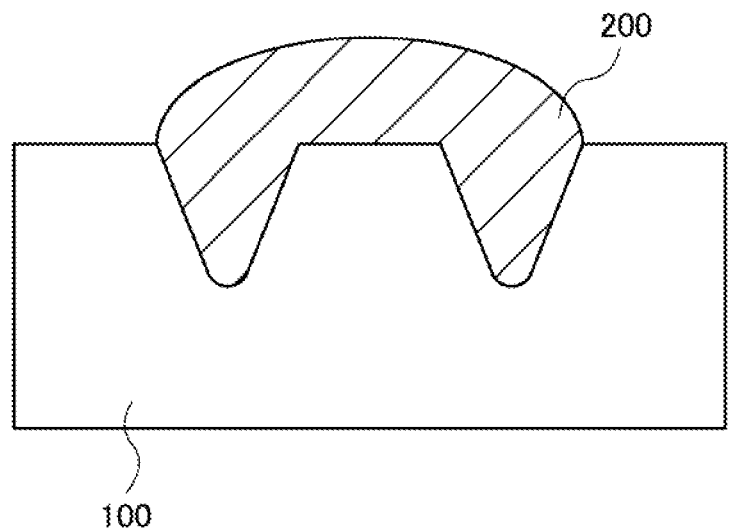
FIG. 3 is a cross-sectional view illustrating an electrode of one embodiment of the present invention.

Note that there may be plural groove portions, and there may be three or more groove portions as illustrated in FIGS. 2A and 2B. Further, FIG. 1A and FIG. 2 each illustrate the case where the cross section of the groove portion has a U-shape in which the width of the groove portion is even in the depth direction; however, the cross section of the groove portion may have a V-shape, as illustrated in FIG. 3, in which the width of the lower side thereof is narrower than the width of the upper side thereof. In the groove portion having a U-shape, the amount of conductive material filling the groove portion can be increased; thus, the resistance of the electrode is easily lowered. In the groove portion having a V-shape, coverage with a film which covers the groove portion can be improved.

Figure 4A:
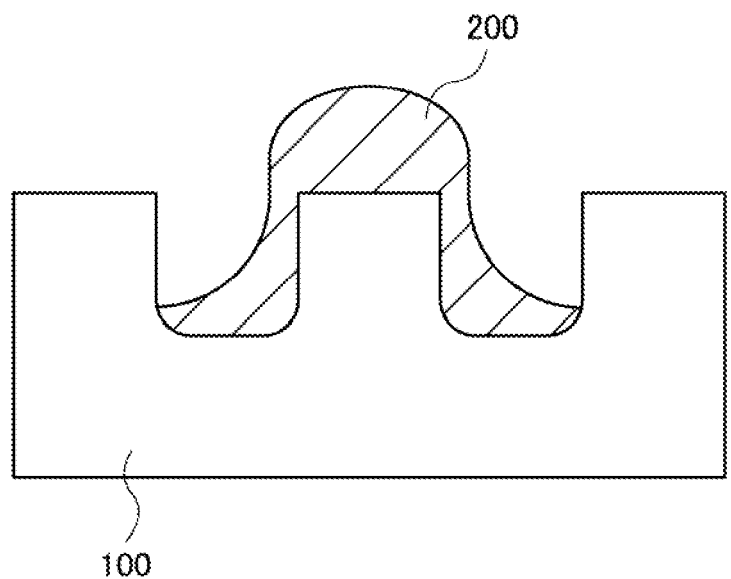
FIGS. 4A and 4B are cross-sectional views illustrating electrodes of one embodiment of the present invention.
Figure 4B:
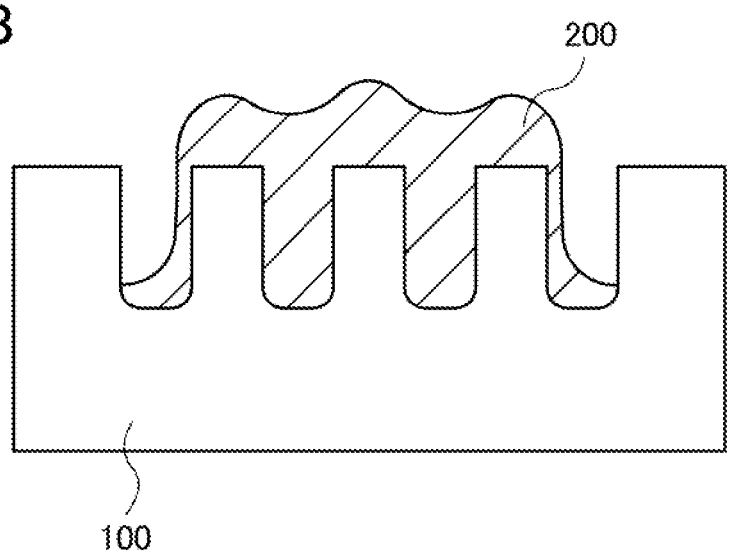

Further, FIG. 1A illustrates a structure where the groove portions are completely filled with a conductive material; however, a conductive material may be partially supplied to the groove portions and fixed as illustrated in FIGS. 4A and 4B. FIG. 4A illustrates a structure where the number of groove portions is two, and FIG. 4B illustrates a structure where the number of groove portions is three or more. When the number of groove portions is three or more, the conductive material is partially supplied to the outermost groove portions (leftmost and rightmost groove portions in the structure of FIG. 4B) and fixed, and the other groove portions (two groove portions in the middle in the structure of FIG. 4B) are filled with the conductive material.

Here, a conventional problem in the case of forming an electrode by a screen printing method is described.

Figure 5A:
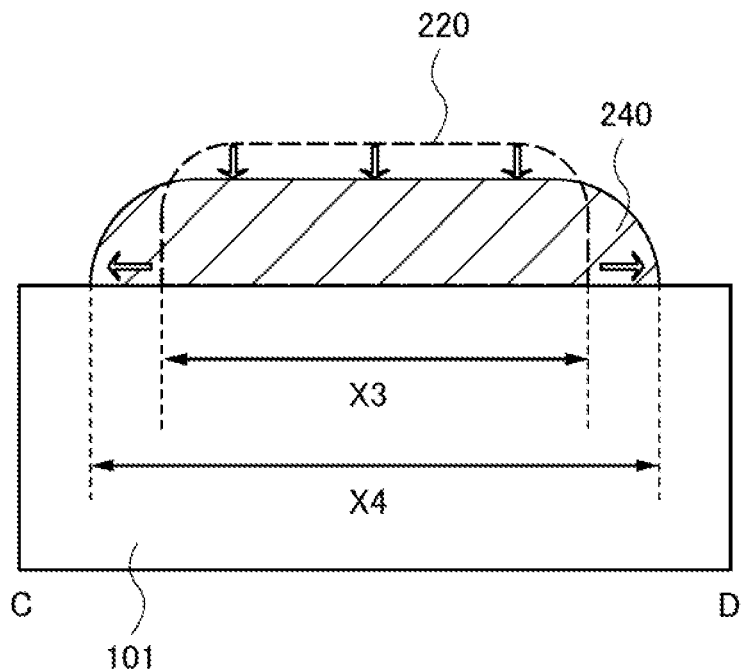
FIGS. 5A and 5B are a cross-sectional view and a plan view illustrating a problem of an electrode formed by a screen printing method.
Figure 5B:
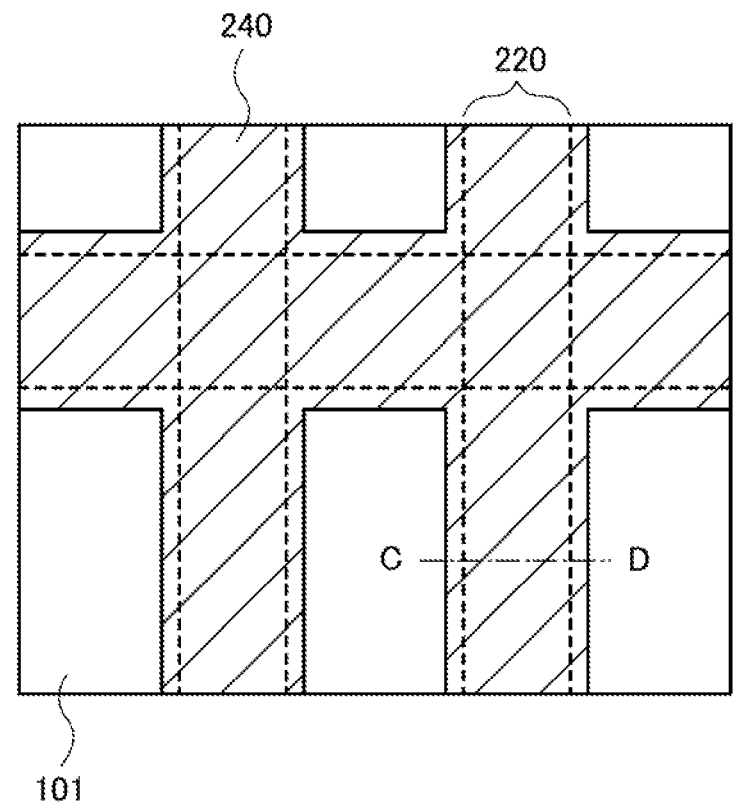

FIGS. 5A and 5B illustrate a structure where an electrode 240 formed of a conductive material is formed over a substrate 101 having a plane by a screen printing method as a conventional example. FIG. 5A is a cross-sectional view and corresponds to a cross section taken along line C-D in FIG. 5B that is a plan view.

A printing resin (here, a conductive resin) used in the screen printing method is adjusted to characteristics appropriate for printing so as to be easily extracted from an opening portion of a printing plate and have the same shape as the opening of the printing plate.

However, the printing resin is in a liquid state in a printing process; thus, the shape of the printing resin is not a little changed in comparison to that just after the printing and the actual size exceeds an acceptable value of a designed width (X3) in some cases. As illustrated in FIG. 5A, the printing resin has an initial shape 220 (dashed line) having a width (X3) almost equivalent to the opening portion of the printing plate just after being extracted from the printing plate; however, the printing resin changes in shape in the direction indicated by arrows before baking, and the width is enlarged to X4.

This phenomenon can be suppressed as much as possible by thinly printing the printing resin; however, the conductive resin has a higher resistance than a metal film, and an electrode, a wiring, and the like whose resistance is preferably low are required to be formed as a thick film. Accordingly, a method in which printing and baking are repeatedly performed a plurality of times needs to be used; thus, there is a problem in that the number of steps is increased.

As a method for substantially forming a thick film, a so-called built-in electrode, which is formed by forming a groove portion in a substrate and filling a conductive material in the groove portion, is known.

However, the conductive material is to fill the groove portion uniformly in the built-in electrode and thus the built-in electrode is not adequate to the screen printing method in which a resin with relatively high viscosity is used. In the screen printing method, a resin is extracted from a printing plate by making the resin filling the printing plate contact with a surface to be printed, so that the resin cannot be provided in a space such as a groove portion. Further, even when the resin is extracted from the printing plate using the periphery of the groove portion, there is a problem in that generated air bubbles cannot be eliminated, for example, due to lack of fluidity of the resin with high viscosity; for that reason, filling of the groove portion is difficult. A method in which a screen printing method is performed under vacuum has been proposed as a means for solving these problems; however, the method has problems of complicating the apparatus and the steps.

Therefore, the screen printing method has not been used under a productive condition for the formation of a built-in electrode.

On the other hand, the electrode of one embodiment of the present invention is formed by supplying an appropriate amount of conductive material to a plurality of groove portions and a region sandwiched between the groove portions. The outermost groove portions become edges, so that the conductive material is not expanded outward, and the electrode with a designed width (X1) can be formed. Further, a region to be printed includes a plane region sandwiched between the groove portions, thus, the resin is easily extracted from the printing plate, and a screen printing method without a special apparatus and complicated steps can be used.

Figure 6A:
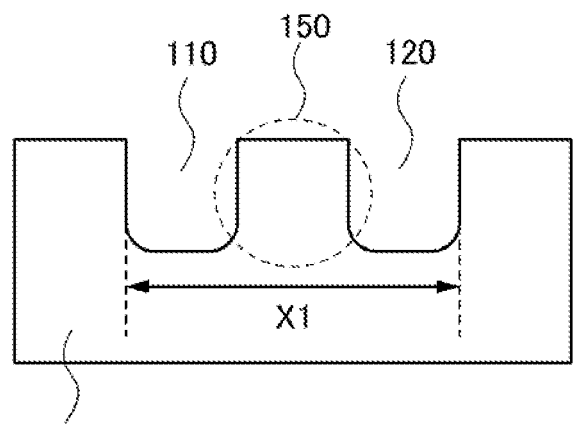
FIGS. 6A to 6C are cross-sectional views illustrating a method for manufacturing an electrode of one embodiment of the present invention.
Figure 6B:
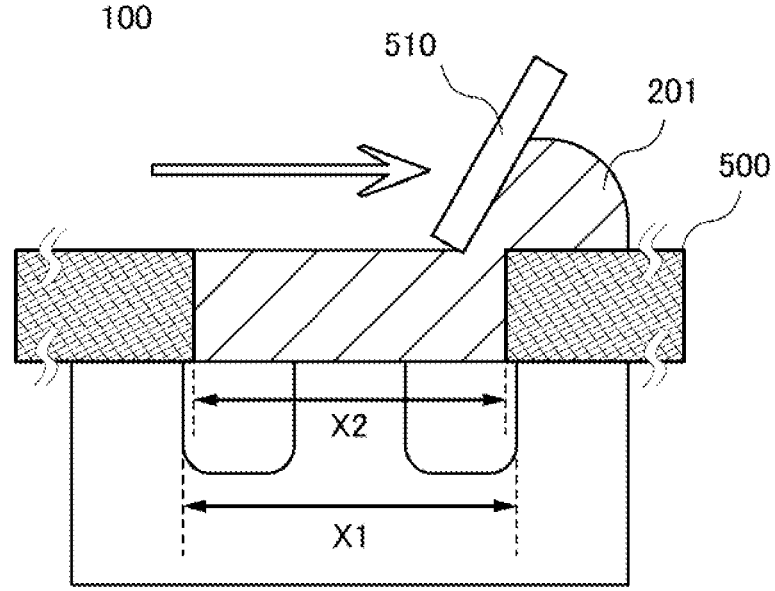
Figure 6C:
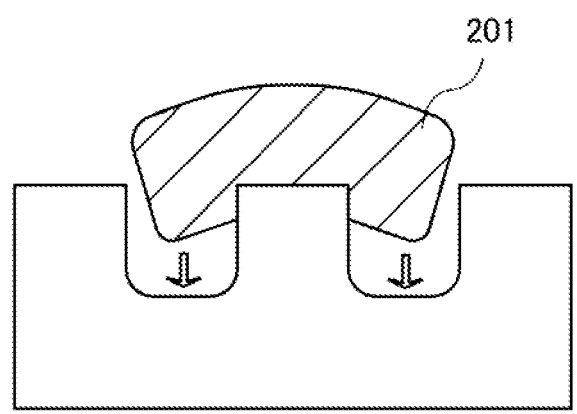

Next, a method for manufacturing an electrode of one embodiment of the present invention is described using a cross-sectional process view of FIGS. 6A to 6C.

First, the first groove portion 110 and the second groove portion 120 are formed in parallel to each other in the substrate 100, and the region 150 sandwiched between the first groove portion 110 and the second groove portion 120 is formed (see FIG. 6A).

The First groove portion 110 and the second groove portion 120 can be formed by a dicing process or a laser process. Although the groove portion in FIG. 6A has a shape (U-shape) in the case of using a dicing process, the groove portion may have a V-shape. When a laser process is performed, the groove portion is likely to have a V-shape or a U-shape. Further, only the bottom portions of the groove portion may be formed to have a V-shape or a U-shape using a dicing blade the periphery of which is processed into a V-shape or a U-shape.

Here, the total width of the first groove portion 110, the second groove portion 120, and the region 150 sandwiched between the first groove portion 110 and the second groove portion 120 is defined as X1. X1 is the width of the electrode, which is a width including an acceptable value designed in advance.

Next, a conductive resin 201 is supplied as a conductive material from above the first groove portion 110, the second groove portion 120, and the region 150 sandwiched between the first groove portion 110 and the second groove portion 120 by a screen printing method. Although the conductive resin 201 can be supplied by a dispenser method or an ink-jet method, it is preferable to use a screen printing method which is excellent in productivity.

FIG. 6B illustrates a process of the supply of the conductive resin 201 by a screen printing method. An opening portion of a printing plate 500 is placed in a position overlapping with the first groove portion 110, the second groove portion 120, and the region 150 sandwiched between the first groove portion 110 and the second groove portion 120; the conductive resin 201 fills the opening portion of the printing plate 500 by a scraper; and the conductive resin 201 is brought into contact with the region 150 by moving a squeegee 510 in contact with the printing plate in the direction indicated by the outline arrow. Then, by moving the printing plate 500, the resin extracted from the printing plate 500 changes in shape so as to flow into the first groove portion 110 and the second groove portion 120 as illustrated in FIG. 6C. Later, the conductive resin 201 fills the first groove portion 110 and the second groove portion 120, and the electrode 200 illustrated in FIG. 1A is formed.

Here, the width in the short axis direction (X2) of the opening portion of the printing plate 500 is preferably smaller than the total width (X1) of the first groove portion 110, the second groove portion 120, and the region 150 sandwiched between the first groove portion 110 and the second groove portion 120. If X2 is larger than X1, not only is the width of the electrode to be formed larger than the designed value, but also the groove portions are covered with the conductive resin 201, whereby inside air cannot be evacuated and poor filling is caused. When X2 is made smaller than X1, an exhaust pathway of air in the groove portions can be secured, so that the groove portions can be uniformly filled with the conductive resin 201.

Note that in the electrode of one embodiment of the present invention, not only is a built-in electrode formed, but also part of the electrode is formed over the region sandwiched between the groove portions. Thus, the area of a cross section of the electrode in the short axis direction can be large and the resistance of the electrode in the long axis direction can be low.

According to the above-described method, an electrode having a designed width with a low resistance can be formed with high productivity and high yield. The present method is effective especially in the case where an electrode having a small width is formed.

This embodiment can be freely combined with any of other embodiments.

Embodiment 2

In this embodiment, a photoelectric conversion device including the electrode described in Embodiment 1 as a grid electrode, and a manufacturing method thereof is described.

Figure 7:
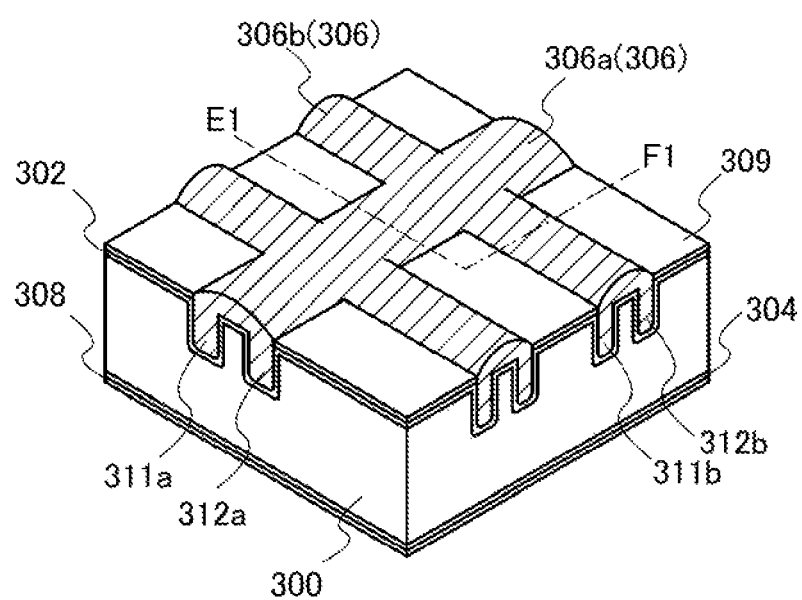
FIG. 7 is a perspective view illustrating a photoelectric conversion device of one embodiment of the present invention.

FIG. 7 is a perspective view illustrating a photoelectric conversion device of one embodiment of the present invention, in which part of the photoelectric conversion device is illustrated for clear explanation of a structure.

The photoelectric conversion device shown in FIG. 7 includes a first impurity layer 302 provided on one surface side of a crystalline silicon substrate 300, a grid electrode 306 and a light-transmitting insulating film 309 which are in contact with the first impurity layer 302, a second impurity layer 304 provided on the other surface side of the crystalline silicon substrate 300, and a rear electrode 308 in contact with the second impurity layer 304. The surface on which the grid electrode 306 is formed is a light-receiving surface.

A first region including a first plurality of parallel groove portions and a region sandwiched between the first parallel groove portions, and a second region including a second plurality of parallel groove portions and a region sandwiched between the second parallel groove portions and crossing the first plurality of parallel groove potions of the first region are formed on one surface of the crystalline silicon substrate 300. Further, the grid electrode 306 is formed by fixing the conductive resin so that the first plurality of groove portions and the second plurality of groove portions are filled and the first region and the second region are covered by the conductive resin. Note that in the grid electrode 306, a region having a large line width is a bus bar electrode 306a and a region having a smaller line width is a finger electrode 306b.

The crystalline, silicon substrate 300 has one conductivity type, and the first impurity layer 302 is a layer haying the opposite conductivity type to that of the crystalline silicon substrate 300. Thus, a p-n junction is formed in the vicinity of a region where the first impurity layer 302 is formed.

Further, the second impurity layer 304 has the same conductivity type as that of the crystalline silicon substrate 300, and is a layer having higher carrier concentration than the crystalline silicon substrate 300. Thus, an n-n$^+$ junction or a p-p$^+$ junction is formed in the vicinity of the region where the second impurity layer 304 is formed, and minority carriers are repelled by the electric field and attracted to the p-n junction side, whereby recombination of carriers in the vicinity of the rear electrode 308 can be prevented.

The second impurity layer 304 can be easily formed by diffusing impurities contained in the rear electrode. For example, when the crystalline silicon substrate 300 has p-type conductivity, an aluminum film or an aluminum paste is formed as the rear electrode, and thermal diffusion of aluminum which is an impurity imparting p-type conductivity is performed, whereby the second impurity layer 304 can be formed.

Further, the light-transmitting insulating film 309 has effects such as protection, antireflection, and a reduction in surface defects of the crystalline silicon substrate 300, and is formed using a silicon oxide film, a silicon nitride film, or the like. Note that the light-transmitting insulating film 309 can be omitted.

The increase in resistance due to miniaturization of the grid electrode 306 can be suppressed by using the grid electrode described in Embodiment 1 in such a structure of the photoelectric conversion device. In other words, a light-receiving area can be increased without an adverse effect (increase in resistance) due to the miniaturization of the grid electrode 306 and the conversion efficiency of the photoelectric conversion device can be improved.

A method for manufacturing the photoelectric conversion device of FIG. 7 is described with reference to FIGS. 8A to 8D. FIGS. 8A to 8D are cross-sectional views which correspond to a cross section taken along line E1-F1 in FIG. 7.

A single crystal silicon substrate or a polycrystalline silicon substrate can be used for the crystalline silicon substrate 300 which can be used in one embodiment of the present invention. The conductivity type and the manufacturing method of the crystalline silicon substrate are not specifically limited. In this embodiment, a p-type single crystal silicon substrate manufactured by a Magnetic Czochralski (MCZ) method is used.

First, a first groove portion 311a, a second groove portion 312a, a region 313a sandwiched between the first groove portion 311a and the second groove portion 312a, a first groove portion 311b, a second groove portion 312b, and a region 313b sandwiched between the first groove portion 311b and the second groove portion 312b are provided on one surface of the crystalline silicon substrate 300 using a method similar to the method for manufacturing the first groove portion 110, and the second groove portion 120 which are described in Embodiment 1.

Here, the first groove portion 311a, the second groove portion 312a, and the region 313a sandwiched between the first groove portion 311a and the second groove portion 312a are correctively referred to as a first region, and the first groove portion 311b, the second groove portion 312b, and the region 313b sandwiched between the first groove portion 311b and the second groove portion 312b are correctively referred to as a second region. Note that a plurality of first regions and second regions may be provided for the crystalline silicon substrate 300. For example, the first regions are provided at intervals of 50 mm and the second regions are provided at intervals of 2 mm.

When the groove portion is formed by a laser process, the fundamental wave (wavelength: 1064 nm), the second harmonic (wavelength: 532 nm), the third harmonic (wavelength: 355 nm), the fourth harmonic (wavelength: 266 nm), or the like of a YAG laser can be used, and a beam diameter, an output, and a scan speed may be adjusted, whereby a groove portion with a desired shape can be formed. For example, when the single crystal silicon substrate is processed using the third harmonic of a YAG laser with a beam diameter φ of 20 µm, a power density of 160 kW/cm$^2$, and a scan speed of 0.1 cm/sec, a groove portion with a width of 30 µm to 40 µm and a depth of 40 µm to 70 µm can be formed.

The first region is a region for the bus bar electrode and the second region is a region for the finger electrode. The widths and the depths of the groove portions in the first and the second regions and the widths of the regions sandwiched between the groove portions may be determined in consideration of the resistance necessary for the bus bar electrode or the finger electrode.

Figure 8A:
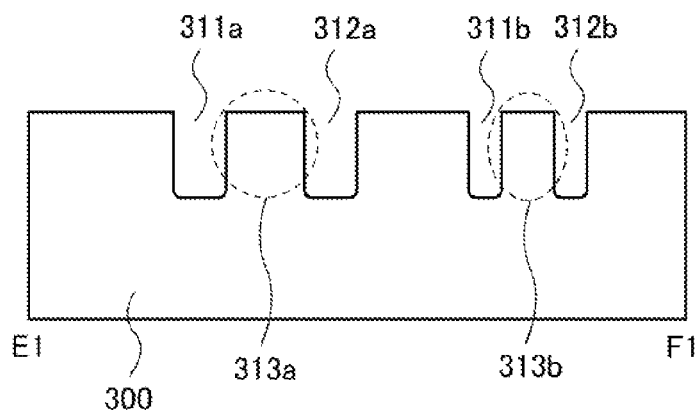
FIGS. 8A to 8D are cross-sectional views illustrating a method for manufacturing a photoelectric conversion device of one embodiment of the present invention.

Note that all the groove portions have the same depth in FIG. 8A; however, the depth of the groove portion in the region where the bus bar electrode is formed may be different from the depth of the groove portion in the region where the finger electrode is formed. The upper limit of the depth of the groove portion is set to be two-thirds, preferably a half, of the thickness of the substrate in consideration of the strength of the substrate. If the groove portion is too deep, the strength of the substrate cannot be maintained and the substrate might be damaged in the middle of a manufacturing process, or the strength of the photoelectric conversion device might be decreased and reliability might be lowered in some cases. In the case where the thickness of the substrate is 0.5 mm, for example, it is preferable that the upper limit of the depth of the groove portion be about 0.25 mm to 0.35 mm.

Next, because a damaged layer is formed on a surface layer of a processed portion by a dicing process or a laser process which is performed for forming the groove portions, the damaged layer is removed by an etching process. In the etching, an etchant including acetic acid, hydrofluoric acid, and nitric acid can be used. The damaged layer can be preferentially etched by adjusting the ratio of the acids. Further, an alkaline etchant (e.g., a 10% aqueous solution of potassium hydroxide) is used so that texture may be formed at the same time as etching the surface of the crystalline silicon substrate 300. By the formation of the texture, effects such as an antireflection effect and a light-trapping effect can be given to the photoelectric conversion device. Note that this etching process can also be omitted.

Figure 8B:
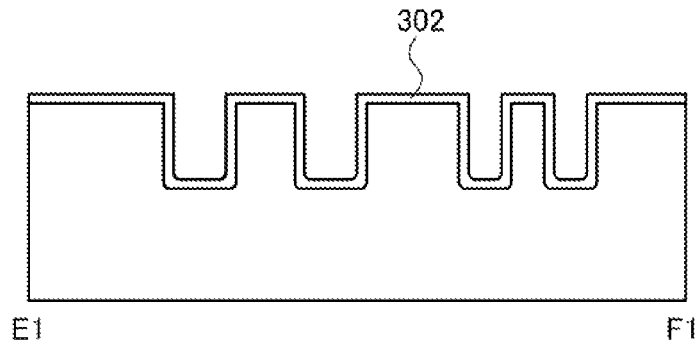

Next, the first impurity layer 302 having the opposite conductivity type to that of the crystalline silicon substrate 300 is formed on one of surface layers of the crystalline silicon substrate 300 including the first region and the second region (see FIG. 8B). Here, the conductivity type of the crystalline silicon substrate 300 is p-type; thus, impurities imparting n-type conductivity are diffused into the surface layer of the crystalline silicon substrate 300, so that the first impurity layer 302 is formed. As an impurity imparting n-type conductivity, phosphorus, arsenic, antimony, or the like can be given. For example, the crystalline silicon substrate is subjected to heat treatment at temperatures of greater than or equal to 800° C. and less than or equal to 900° C. in an atmosphere of phosphorous oxychloride, whereby phosphorus can be diffused at a depth of approximately 0.5 µm from the surface of the crystalline silicon substrate.

Next, the light-transmitting insulating film 309 is formed over the first impurity layer 302. A silicon oxide film or a silicon nitride film with a thickness of greater than or equal to 50 nm and less than or equal to 100 nm, which is formed by a plasma CVD method or a sputtering method, can be used as the light-transmitting insulating film 309. In this embodiment, a silicon nitride film with a thickness of 50 nm formed by a plasma CVD method is used as the light-transmitting insulating film 309. Note that the step for forming the light-transmitting insulating film 309 may be omitted.

Figure 8C:
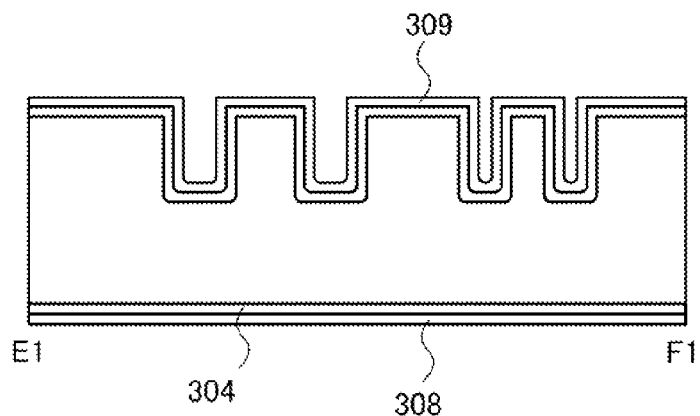

Then, the second impurity layer 304 and the rear electrode 308 are formed (see FIG. 8C). In this embodiment, the conductivity type of the crystalline silicon substrate is p-type: thus, a conductive layer including impurities imparting p-type conductivity is formed on the other surface of the crystalline silicon substrate 300, and the impurities are diffused to form a layer with a high carrier concentration, so that p-p$^+$ junction is formed. The second impurity layer 304 and the rear electrode 308 can be formed, for example, in the following manner: an aluminum paste is applied to the other surface of the crystalline silicon substrate 300 and baking is performed to thermally diffuse aluminum into the surface layer of the other surface of the crystalline silicon substrate 300.

Then, by a screen printing method, a conductive resin to be the grid electrode 306 is supplied to the first region and the second region over which the light-transmitting insulating film 309 is formed on the first impurity layer 302. The description of Embodiment 1 with reference to FIG. 6B can be referred to for details of the process of the screen printing method. Note that the conductive resin used here may be a silver paste, a copper paste, a nickel paste, a molybdenum paste, or the like. Further, the grid electrode 306 may be a stacked layer of different materials, such as a stacked layer of a silver paste and a copper paste. In this embodiment, a thermosetting conductive resin which is fixed by being baked is preferably used.

Figure 8D:
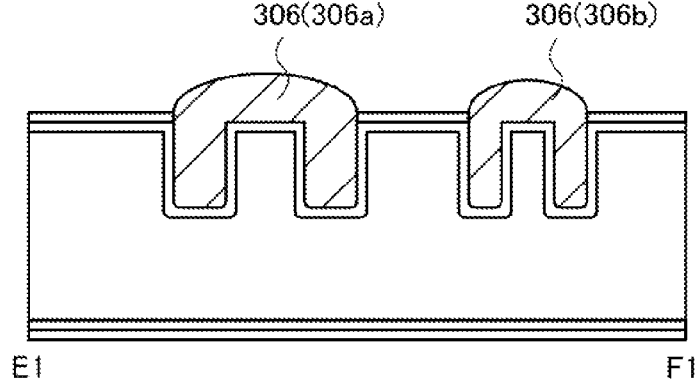

Subsequently, by baking the conductive resin, the first impurity layer 302 is iii contact with the grid electrode 306 (see FIG. 8D). The conductive resin is not in contact with the first impurity layer 302 at the aforementioned stage where the conductive resin is supplied because the light-transmitting insulating film 309 is interposed therebetween. However, the conductor component of the conductive resin can penetrate the light-transmitting insulating film 309 and be in contact with the first impurity layer 302 by baking the conductive resin. Note that the light-transmitting insulating film 309 formed in the groove portions seems to totally disappear in FIG. 8D; however, the light-transmitting insulating film 309 may partially remain.

As described above, a photoelectric conversion device which has a minute grid electrode and excellent electric characteristics can be formed with high productivity and high yield.

This embodiment can be freely combined with any of other embodiments.

Embodiment 3

In this embodiment, a photoelectric conversion device which has a different structure from that of the photoelectric conversion device described in Embodiment 2 and a manufacturing method thereof are described. Note that detailed description of the structure and the manufacturing method which are common to those of Embodiment is omitted.

Figure 9:
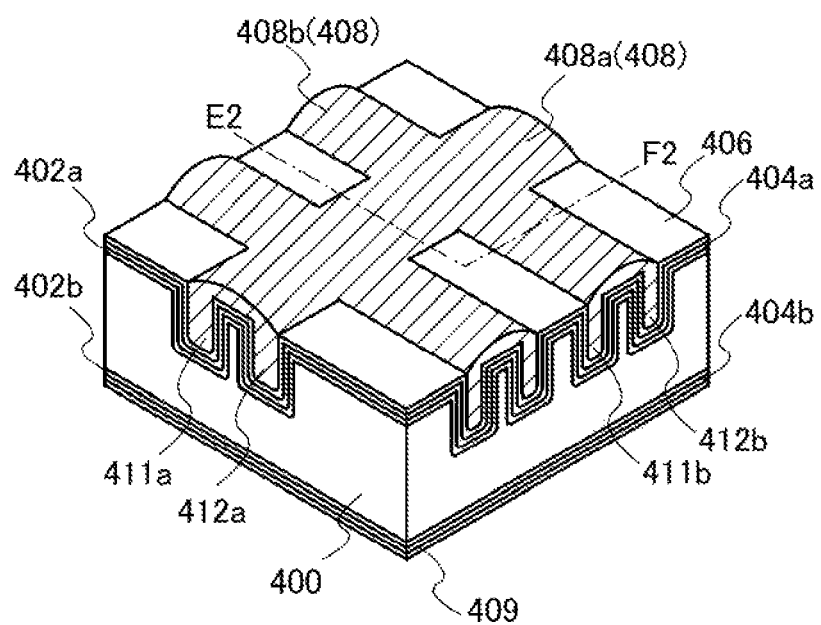
FIG. 9 is a perspective view illustrating a photoelectric conversion device of one embodiment of the present invention.

FIG. 9 is a perspective view illustrating a photoelectric conversion device of one embodiment of the present invention, in which part of the photoelectric conversion device is illustrated for clear explanation of a structure.

The photoelectric conversion device shown in FIG. 9 includes a first silicon semiconductor layer 402a and a third silicon semiconductor layer 402b both in contact with a crystalline silicon substrate 400, a second silicon semiconductor layer 404a in contact with the first silicon semiconductor layer 402a, a fourth silicon semiconductor layer 404b in contact with a third silicon semiconductor layer 402b, a light-transmitting conductive film 406 in contact with the second silicon semiconductor layer 404a, a grid electrode 408 in contact with the light-transmitting conductive film 406, and a rear electrode 409 in contact with the fourth silicon semiconductor layer 404b. The surface on which the grid electrode 408 is formed is a light-receiving surface.

The first silicon semiconductor layer 402a and the third silicon semiconductor layer 402b contain hydrogen and are high-quality i-type semiconductor layers with few defects. The first silicon semiconductor layer 402a and the third silicon semiconductor layer 402b can terminate defects on the surface of the crystalline silicon substrate 400 and can reduce recombination of minority carriers in the photoelectric conversion layer, so that the lifetime of the minority carriers can be lengthened.

Note that in this specification, an i-type semiconductor refers to not only a so-called intrinsic semiconductor in which the Fermi level lies in the middle of the band gap, but also a semiconductor in which the concentrations of an impurity imparting p-type conductivity and an impurity imparting n-type conductivity are less than or equal to $1 \times 10^{20}$ atoms/cm$^3$ and photoconductivity is high as compared with dark conductivity. An amorphous silicon semiconductor formed by a plasma CVD method or the like can be used for the first silicon semiconductor layer 111 and the third silicon semiconductor layer 113.

Note that a photoelectric conversion layer in this specification refers to a semiconductor region that greatly contributes to photoelectric conversion. In this embodiment, it corresponds to the crystalline silicon substrate and the first silicon semiconductor layer 402a and the third silicon semiconductor layer 402h that are in contact with the crystalline silicon substrate.

The second silicon semiconductor layer 404a and the fourth silicon semiconductor layer 404b are internal electric field formation layers and one of the second silicon semiconductor layer 404a and the fourth silicon semiconductor layer 404b is a p-type semiconductor layer, and the other is an n-type semiconductor layer. The second silicon semiconductor layer 404a and the fourth silicon semiconductor layer 404b can be formed using amorphous silicon layers or microcrystalline silicon layers containing an impurity imparting a conductivity type, for example.

A first region including a first plurality of parallel groove portions and a region sandwiched between the first parallel groove portions, and a second region including a second plurality of parallel groove portions and a region sandwiched between the second parallel groove portions and crossing the first plurality of parallel groove potions of the first region are formed on one surface of the crystalline silicon substrate 400. The grid electrode 408 is formed of a conductive resin to fill the first plurality of parallel groove portions and the second plurality of parallel groove portions and to cover the first region and the second region. Note that in the grid electrode, the region having a large line width is a bus bar electrode 408a and the region having a smaller line width is a finger electrode 408b.

The increase in resistance due to miniaturization of the grid electrode 408 can be suppressed by using the grid electrode described in Embodiment 1 in such a structure of the photoelectric conversion device. In other words, a light-receiving area can be increased without an adverse effect (increase in resistance) due to the miniaturization of the grid electrode 408 and the conversion efficiency of the photoelectric conversion device can be improved.

A method for manufacturing the photoelectric conversion device of FIG. 9 is described with reference to FIGS. 10A to 10D. FIGS. 10A to 10D are cross-sectional views which correspond to a cross section taken along line E2-F2 in FIG. 9.

A single crystal silicon substrate or a polycrystalline silicon substrate can be used for the crystalline silicon substrate 400 which can be used in one embodiment of the present invention. The Conductivity type and the manufacturing method of the crystalline silicon substrate are not specifically limited. In this embodiment, an n-type single crystal silicon substrate manufactured by a Magnetic Czochralski (MCZ) method is used.

First, a first groove portion 411a, a second groove portion 412a, a region 413a sandwiched between the first groove portion 411a and the second groove portion 412a, a first groove portion 411b, a second groove portion 412b, and a region 413b sandwiched between the first groove portion 411b and the second groove portion 412b are provided on one surface of the crystalline silicon substrate 400 using a method similar to the method for manufacturing the first groove portion 110, and the second groove portion 120 which are described in Embodiment 1.

Here, the first groove portion 411a, the second groove portion 412a, and the region 413a sandwiched between the first groove portion 411a and the second groove portion 412a are correctively referred to as a first region, and the first groove portion 411b, the second groove portion 412b, and the region 413b sandwiched between the first groove portion 411b and the second groove portion 412b are collectively referred to as a second region. Note that a plurality of first regions and second regions may be provided for the crystalline silicon substrate 400. For example, the first regions are provided at intervals of 50 mm and the second regions are provided at intervals of 2 mm.

The first region is a region for the bus bar electrode and a second region is a region for the finger electrode. The widths and the depths of the groove portions in the first and the second regions and the widths of the regions sandwiched between the groove portions may be determined in consideration of the resistance necessary for the bus bar electrode or the finger electrode.

Next, a damaged layer formed on a surface layer of the groove portions is removed by an etching process. In the etching, an etchant including acetic acid, hydrofluoric acid, and nitric acid can be used. Further, an alkaline etchant (e.g., a 10% aqueous solution of potassium hydroxide) is used so that texture may be formed at the same time as etching the surface of the crystalline silicon substrate 400. By the formation of the texture, effects of an antireflection effect and a light-trapping effect can be given to the photoelectric conversion device. Note that this etching process can also be omitted.

Next, a first silicon semiconductor layer 402a is formed on one surface of the crystalline silicon substrate, 400 including the first region and the second region. The thickness of the first silicon semiconductor layer 402a is preferably greater than or equal to 3 nm and less than or equal to 50 nm. In this embodiment, the first silicon semiconductor layer 402a is i-type amorphous silicon and has a thickness of 5 nm.

An example of film formation conditions of the first silicon semiconductor layer 402a is as follows: monosilane is introduced to a reaction chamber at a flow rate of greater than or equal to 5 sccm and less than or equal to 200 sccm; the pressure inside the reaction chamber is greater than or equal to 10 Pa and less than or equal to 100 Pa; the electrode interval is greater than or equal to 15 mm and less than or equal to 40 mm; and the power density is greater than or equal to 8 mW/cm$^2$ and less than or equal to 50 mW/cm$^2$.

Next, the second silicon semiconductor layer 404a is formed on the first silicon semiconductor layer 402a. The thickness of the second silicon semiconductor layer 404a is preferably greater than or equal to 3 nm and less than or equal to 50 nm. In this embodiment, the second silicon semiconductor layer 404a is p-type microcrystalline silicon and has a thickness of 10 nm. Note that p-type amorphous silicon may be used for the second silicon semiconductor layer 404a.

An example of film formation conditions of the second silicon semiconductor layer 404a is as follows: monosilane with a flow rate of greater than or equal to 1 sccm and less than or equal to 10 sccm, hydrogen with a flow rate of greater than or equal to 100 sccm and less than or equal to 5000 sccm, and hydrogen-based diborane (0.1%) with a flow rate of greater than or equal to 5 sccm and less than or equal to 50 sccm are introduced to the reaction chamber; the pressure inside the reaction chamber is set to greater than or equal to 450 Pa and less than or equal to 100000 Pa, preferably greater than or equal to 2000 Pa and less than or equal to 50000 Pa; the electrode interval is set to greater than or equal to 8 mm and less than or equal to 30 mm, and the power density is set to greater than or equal to 200 mW/cm$^2$ and less than or equal to 1500 mW/cm$^2$.

Then, the other surface of the crystalline silicon substrate 400 is subjected to a plasma CVD method, so that the third silicon semiconductor layer 402b is formed. The thickness of the third silicon semiconductor layer 402b is preferably greater than or equal to 3 nm and less than or equal to 50 nm. In this embodiment, the third silicon semiconductor layer 402b is an i-type silicon semiconductor has a thickness of 5 nm. Note that the third silicon semiconductor layer 402b can be formed under the film formation conditions similar to those of the first silicon semiconductor layer 402a.

Figure 10A:
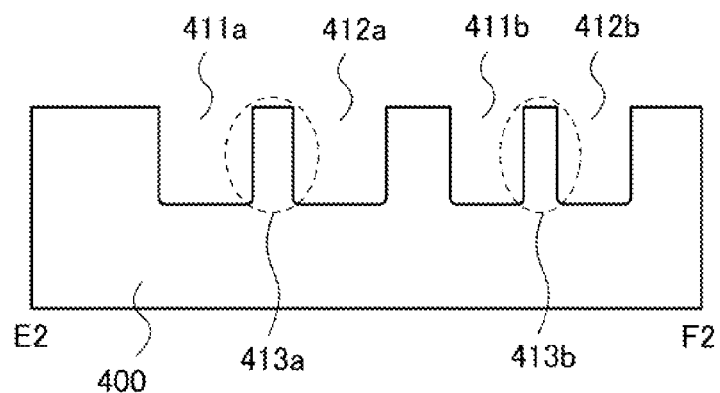
FIGS. 10A to 10D are cross-sectional views illustrating a method for manufacturing a photoelectric conversion device of one embodiment of the present invention.
Figure 10B:
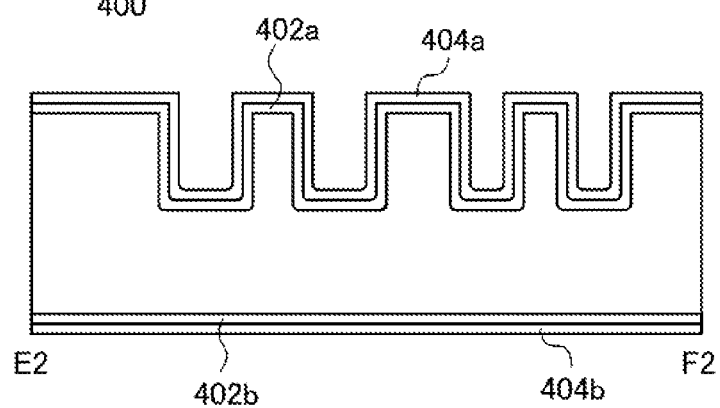

Next, the fourth silicon semiconductor layer 404b is formed on the third silicon semiconductor layer 402b (see FIG. 10B). The thickness of the fourth silicon semiconductor layer 404b is preferably greater than or equal to 3 nm and less than or equal to 50 nm. In this embodiment, the fourth silicon semiconductor layer 404b is n-type microcrystalline silicon and has a thickness of 10 nm. Note that n-type amorphous silicon may be used for the fourth silicon semiconductor layer 404b.

An example of film formation conditions of the fourth silicon semiconductor layer 404b is as follows: monosilane with a flow rate of greater than or equal to 1 sccm and less than or equal to 10 sccm, hydrogen with a flow rate of greater than or equal to 100 sccm and less than or equal to 5000 sccm, and hydrogen-based phosphine (0.5%) with a flow rate of greater than or equal to 5 sccm and less than or equal to 50 sccm are introduced to the reaction chamber; the pressure inside the reaction chamber is set to greater than or equal to 450 Pa and less than or equal to 100000 Pa, preferably greater than or equal to 2000 Pa and less than or equal to 50000 Pa; the electrode interval is set to greater than or equal to 8 mm and less than or equal to 30 mm, and the power density is set to greater than or equal to 200 mW/cm$^2$ and less than or equal to 1500 mW/cm$^2$.

Note that in this embodiment, although an RF power source with a frequency of 13.56 MHz is used as a power source in forming the above-described amorphous silicon layers and microcrystalline silicon layers, an RF power source with a frequency of 27.12 MHz, 60 MHz, or 100 MHz may be used instead. Further, film formation may be performed by pulsed discharge as well as by continuous discharge. By the pulsed discharge, film quality can be improved and generation of particles in a gas phase can be reduced.

Then, the light-transmitting conductive film 406 is formed over the second silicon semiconductor layer 404a. For the light-transmitting conductive film 406, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The light-transmitting conductive film 406 is not limited to a single layer, and may be a stacked layer of different films. For example, a stacked layer of indium tin oxide and zinc oxide containing aluminum, a stacked layer of indium tin oxide and tin oxide containing fluorine, or the like can be used. A total film thickness is to be greater than or equal to 10 nm and less than or equal to 1000 nm. The surface of the light-transmitting conductive film 406 may have a texture structure.

Figure 10C:
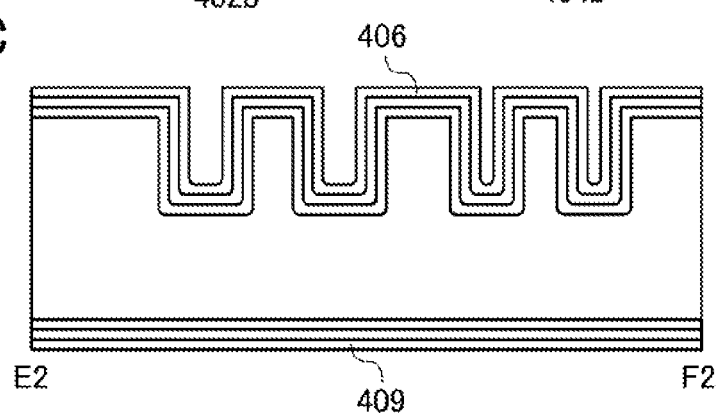
Figure 10D:
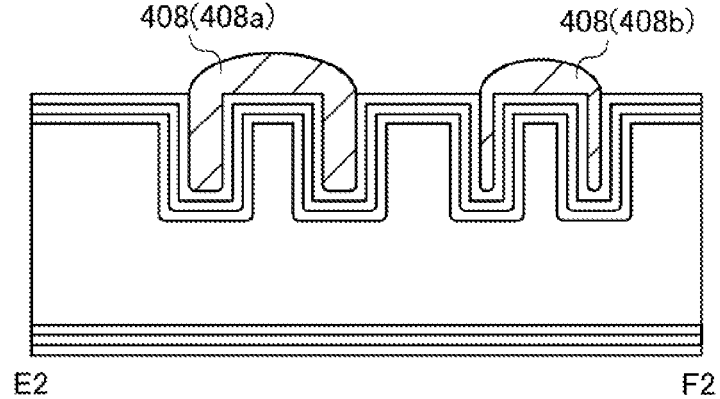

Next, the rear electrode 409 is formed on the fourth silicon semiconductor layer 404b (see FIG. 10C). The rear electrode 409 can be formed of a low resistance metal such as silver, aluminum, or copper by a sputtering method, a vacuum evaporation method, or the like. Alternatively, the rear electrode 409 may be formed of a conductive resin such as a silver paste or a copper paste by a screen printing method.

Note that the formation order of the films provided on the front and the rear of the crystalline silicon substrate 400 is not limited to the order described above as long as the structure shown in FIG. 10C can be obtained. For example, the first silicon semiconductor layer 402a may be formed, and then the third silicon semiconductor layer 402b may be formed.

Then, by a screen printing method, a conductive resin to be the grid electrode 408 is supplied so as to fill the groove portions and the region sandwiched between the groove portions in the first region and the second region over which the first silicon semiconductor layer 402a, the second silicon semiconductor layer 404a, and the light-transmitting conductive film 406 are stacked. The description of Embodiment 1 illustrated in FIG. 68 can be referred to for details of the process of the screen printing method. The grid electrode 408 is fixed by fixing the conductive resin.

As described above, a photoelectric conversion device which has a minute grid electrode and excellent electric characteristics can be formed with high productivity and high yield.

This embodiment can be freely combined with any of other embodiments.

EXAMPLE

In this example, the electrode formed in accordance with Embodiment 1 is described.

A single crystal silicon substrate was used for a substrate, and a groove portion was formed by a laser process. For a laser device, a nanosecond pulsed laser (µFlare PQ GR with a wavelength of 532 nm) produced by INNOLIGHT GmbH was used. The beam diameter φ was adjusted to 20 µm with an optical system, and the single crystal silicon substrate was processed with an output of 0.36 W and a scan rate of 1 cm/sec in accordance with a designed value. Note that the designed value of a width of an electrode in this example (X1: the total width of groove portions and a region sandwiched between the groove portions) was 80 µm.

Subsequently, a conductive material was supplied to the groove portions and the region sandwiched between the groove portions by a screen printing method. A mesh plate whose width of an opening portion was 60 µm (X2) and an emulsion thickness was 30 µm was used for a printing plate. A silver paste (AGEP-201X) produced by Sumitomo Electric Industries, Ltd was used for a conductive material. The conductive material was baked at 150° C. for 30 minutes in a hot air circulation drying furnace after being supplied.

Figure 11A:
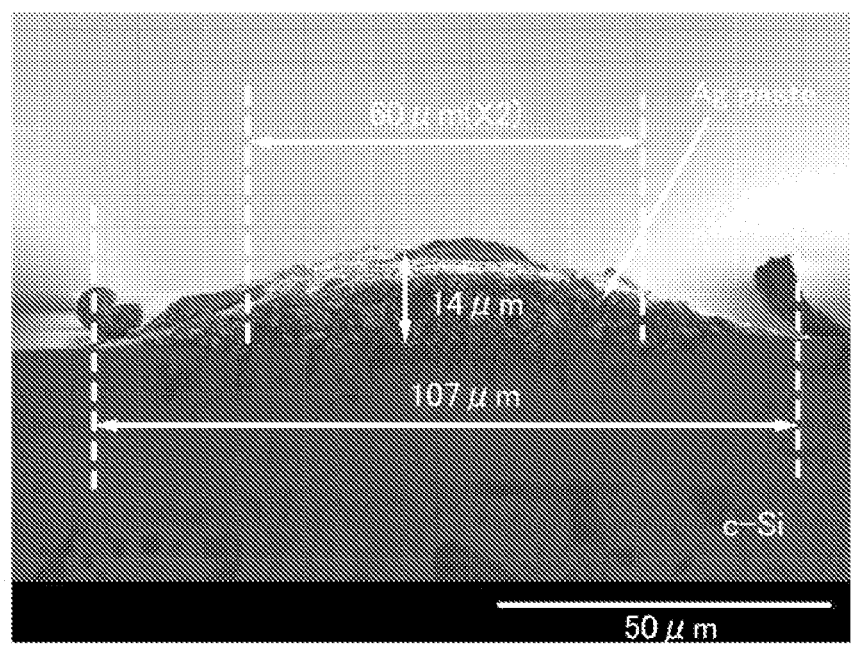
FIGS. 11A and 11B are cross-sectional SEM images of an electrode of a comparative example and an electrode of one embodiment of the present invention.

FIG. 11A is a SEM image of a cross section of a sample. In the sample, as a comparative example, an electrode was formed using the printing plate and the conductive material without forming a groove portion in the single crystal silicon substrate. The width of the formed electrode was extended to about 107 µm, whereas the width of the opening portion was 60 µm. Further, the thickness near the center of the electrode was 14 µm, and the aspect ratio of the electrode thickness to the electrode width was about 0.13.

Figure 11B:
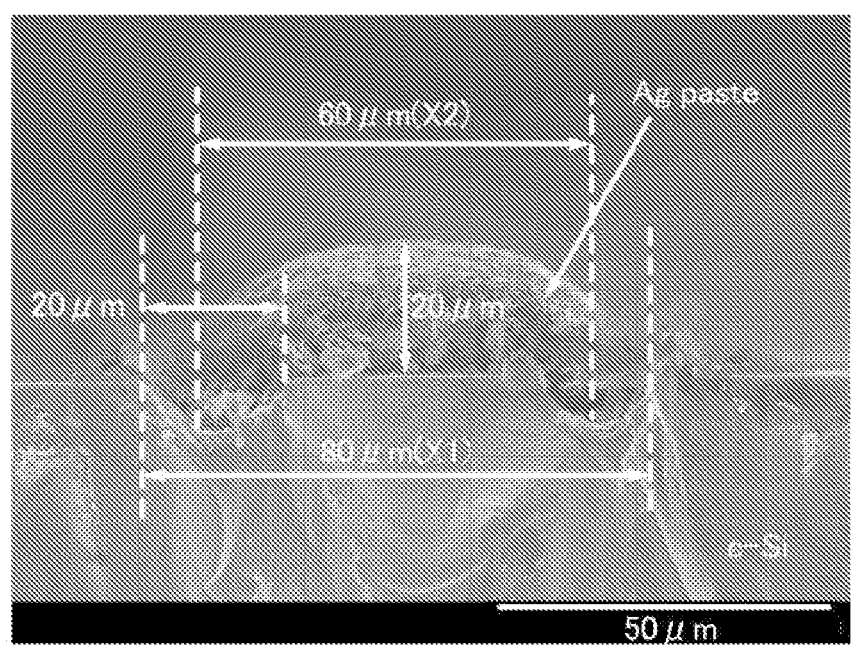

FIG. 11B is a SEM, image of a cross section of a sample. In the sample, groove portions were formed in the single crystal silicon substrate by the aforementioned method and an electrode was formed in a manner similar to the comparative example. A V-shape groove with a width of about 20 µm, whose width is almost the same as the beam diameter φ, 20 µm, was formed. The formed two groove portions become edges, so that the conductive material was not expanded outward, and the electrode with a designed width (X1) was formed. Further, the thickness near the center of the electrode was about 20 µm, and an aspect ratio of an electrode thickness to an electrode width was about 0.25.

The above shows that groove portions having a designed width (X1) can be formed and an electrode with a high aspect ratio can be formed according to one embodiment of the present invention.

This application is based on Japanese Patent Application serial no. 2010-286810 filed with Japan Patent Office on Dec. 23, 2010, the entire contents of which are hereby incorporated by reference.

What is claimed is:

1. A method for manufacturing an electrode, comprising the steps of:
    forming a first groove portion and a second groove portion being parallel with the first groove portion in a substrate;
    disposing a printing plate having an opening portion over the substrate, wherein the opening portion of the printing plate is placed in a position overlapping with the first groove portion, the second groove portion, and a region between the first groove portion and the second groove portion, and wherein a width of the opening portion of the printing plate is smaller than a total width of the first groove portion, the second groove portion and the region between the first groove portion and the second groove portion;
    filling the opening portion of the printing plate with a conductive material so that the conductive material is in contact with the region between the first groove portion and the second groove portion;
    removing the printing plate so that the conductive material flows into the first groove portion and the second groove portion; and
    fixing the conductive material,
    wherein the conductive material fills in the first groove portion and the second groove portion.

2. The method for manufacturing an electrode according to claim 1, wherein the substrate is a semiconductor substrate.

3. The method for manufacturing an electrode according to claim 1, wherein the conductive material is a conductive resin.

4. The method for manufacturing an electrode according to claim 3, wherein the conductive resin is one selected from the group consisting of a silver paste, a copper paste, a nickel paste, a molybdenum paste.

5. The method for manufacturing an electrode according to claim 1, wherein the conductive material is fixed by baking the conductive material.

6. A method for manufacturing a photoelectric conversion device, comprising the steps of:
   forming a first groove portion and a second groove portion being parallel with the first groove portion in a semiconductor substrate;
   forming a first impurity layer over a surface of the semiconductor substrate including the first groove portion and the second groove portion;
   disposing a printing plate having an opening portion over the semiconductor substrate, wherein the opening portion of the printing plate is placed in a position overlapping with the first groove portion, the second groove portion, and a region between the first groove portion and the second groove portion, and wherein a width of the opening portion of the printing plate is smaller than a total width of the first groove portion, the second groove portion and the region between the first groove portion and the second groove portion;
   supplying filling the opening portion of the printing plate with a conductive material so that the conductive material is in contact with the region between the first groove portion and the second groove portion;
   removing the printing plate so that the conductive material flows into the first groove portion and the second groove portion; and
   fixing the conductive material,
   wherein the conductive material fills in the first groove portion and the second groove portion.

7. The method for manufacturing a photoelectric conversion device according to claim 6, wherein the conductive material is a conductive resin.

8. The method for manufacturing a photoelectric conversion device according to claim 7, wherein the conductive resin is one selected from the group consisting of a silver paste, a copper paste, a nickel paste, a molybdenum paste.

9. The method for manufacturing a photoelectric conversion device according to claim 6, wherein the conductive material is fixed by baking the conductive material.

10. The method for manufacturing a photoelectric conversion device according to claim 6, wherein the first impurity layer has a conductivity type opposite to the semiconductor substrate.

11. The method for manufacturing a photoelectric conversion device according to claim 6, further comprising the step of forming an insulating layer over the first impurity layer, wherein the conductive material is formed over the insulating layer.

12. The method for manufacturing a photoelectric conversion device according to claim 6, further comprising the steps of:
   forming a second impurity layer over the first impurity layer; and
   forming a light-transmitting conductive film over the second impurity layer,
   wherein the conductive material is formed over the light-transmitting conductive film.

13. The method for manufacturing a photoelectric conversion device according to claim 12,
   wherein the first impurity layer is an i-type amorphous silicon layer, and wherein the second impurity layer has a p-type conductivity type.

* * * * *

UNITED STATES PATENT AND TRADEMARK OFFICE
CERTIFICATE OF CORRECTION

PATENT NO. : 8,735,213 B2
APPLICATION NO. : 13/325166
DATED : May 27, 2014
INVENTOR(S) : Oda et al.

It is certified that error appears in the above-identified patent and that said Letters Patent is hereby corrected as shown below:

In the Specification:

Column 1, line 28; "alone" should read --along--.

Column 1, line 39; "Further; the" should read --Further, the--.

Column 2, line 25; "portions; a" should read --portions, a--.

Column 2, line 27; "outertmost" should read --outermost--.

Column 3, line 35 and 36; "conductive, film" should read --conductive film--.

Column 5, line 19; "of present" should read --of the present--.

Column 6, line 52; "tilling" should read --filling--.

Column 7, line 27; "The First," should read --The first--.

Column 8, line 61; "crystalline, silicon" should read --crystalline silicon--.

Column 8, line 62; "haying," should read --having--.

Column 11, line 5; "sec" should read --see--.

Column 11, line 6; "p-type:" should read --p-type;--.

Column 11, line 32; "iii" should read --in--.

Column 11, line 58; "Embodiment is" should read --Embodiment 1 is--.

Column 12, line 34; "**402*h*," should read --402*b*--.

Column 13, line 9; "The Conductivity" should read --The conductivity--.

Signed and Sealed this
Fourteenth Day of October, 2014

Michelle K. Lee
*Deputy Director of the United States Patent and Trademark Office*

CERTIFICATE OF CORRECTION (continued)
U.S. Pat. No. 8,735,213 B2

Column 13, line 55; "substrate, 400," should read --substrate 400--.

Column 14, line 33; "semiconductor has" should read --semiconductor layer and has--.

Column 15, line 39; "FIG. 68" should read --FIG. 6B--.